(12) United States Patent
Avanzino

(10) Patent No.: US 7,148,144 B1
(45) Date of Patent: Dec. 12, 2006

(54) METHOD OF FORMING COPPER SULFIDE LAYER OVER SUBSTRATE

(75) Inventor: Steven C. Avanzino, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 229 days.

(21) Appl. No.: 10/939,897

(22) Filed: Sep. 13, 2004

(51) Int. Cl.
  *H01L 21/44* (2006.01)
(52) U.S. Cl. .................................. 438/687; 438/618
(58) Field of Classification Search ................ 438/99, 438/618, 622, 624, 680, 681, 687, 780, 642, 438/761, 763
  See application file for complete search history.

(56) References Cited

U.S. PATENT DOCUMENTS

| | | | |
|---|---|---|---|
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B1 | 7/2004 | Krieger et al. | |
| 6,753,954 B1 | 8/2004 | Subramanian et al. | |
| 6,770,905 B1 | 8/2004 | Buynoski et al. | |
| 6,781,868 B1 | 8/2004 | Bulovic et al. | |
| 6,787,458 B1 | 9/2004 | Tripsas et al. | |
| 6,798,068 B1 * | 9/2004 | Oglesby ..................... | 257/759 |
| 6,893,895 B1 * | 5/2005 | Okoroanyanwu et al. ..... | 438/99 |
| 7,015,504 B1 * | 3/2006 | Lyons et al. ................. | 257/40 |

\* cited by examiner

*Primary Examiner*—Kevin M. Picardat
(74) *Attorney, Agent, or Firm*—Amin & Turocy, LLP

(57) ABSTRACT

Methods of forming copper sulfide regions or layers over a substrate are disclosed. The copper sulfide regions or layers are formed by contacting a sulfide compound with a substrate containing at least copper and contacting a copper vapor precursor with the substrate to form the copper sulfide layer. Methods of making a memory devices/cells containing a copper sulfide layer, methods of using the memory devices/cells, and devices such as computers containing the memory devices/cells are also disclosed.

28 Claims, 4 Drawing Sheets

METHOD OF FORMING COPPER SULFIDE LAYER OVER SUBSTRATE

TECHNICAL FIELD

The present invention generally relates to forming copper sulfide regions or layers over a substrate or in memory devices, and method of making of memory devices containing the copper sulfide region or layer. In particular, the present invention relates to forming a copper sulfide layer on a substrate by contacting a sulfide compound with the substrate and contacting a copper vapor precursor with the substrate.

BACKGROUND ART

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller feature sizes and more precise feature shapes are required. This may include the width, thickness and spacing of interconnecting lines, spacing and diameter of contact holes, and the surface geometry, such as corners and edges, of various features.

The requirement of small features with close spacing between adjacent features requires sophisticated manufacturing techniques to ensure that quality and operability of the features are not compromised for the purpose of reducing feature size. Among the many aspects related to improving semiconductor fabrication processing to achieve higher density devices, the ability to form thin films, which are substantially free from impurities and defects, remains critical to the structural integrity of smaller features as well as to the performance of the device with respect to increasing the speed of the device. Even minor impurities or defects present on the thin film layer tend to result in poor device characteristics, thereby reducing the effectiveness of the semiconductor device.

Thus, an efficient method to form a thin film is desired to increase productivity, quality, and reliability in IC manufacture.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides methods of forming copper sulfide regions or layers over a substrate or in memory cells. The memory cell containing the copper sulfide layer that is made by the method possess one or more of the following: capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

One aspect of the present invention relates to a method of making a copper sulfide layer. The method includes contacting a sulfide compound with a substrate containing at least copper and contacting a copper vapor precursor with the substrate to form the copper sulfide layer.

Another aspect of the present invention relates to a method of making a memory cell containing: providing a first electrode containing at least copper; contacting a sulfide compound with the first electrode and contacting a copper vapor precursor with the first electrode to form a copper sulfide layer on the first electrode; forming an active layer over the copper sulfide layer; and forming a second electrode over the active layer.

Yet another aspect of the present invention relates to a copper sulfide layer on a substrate containing at least copper, the copper sulfide layer made by contacting a sulfide compound with the substrate and contacting a copper vapor precursor with the substrate.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

Figure 1:
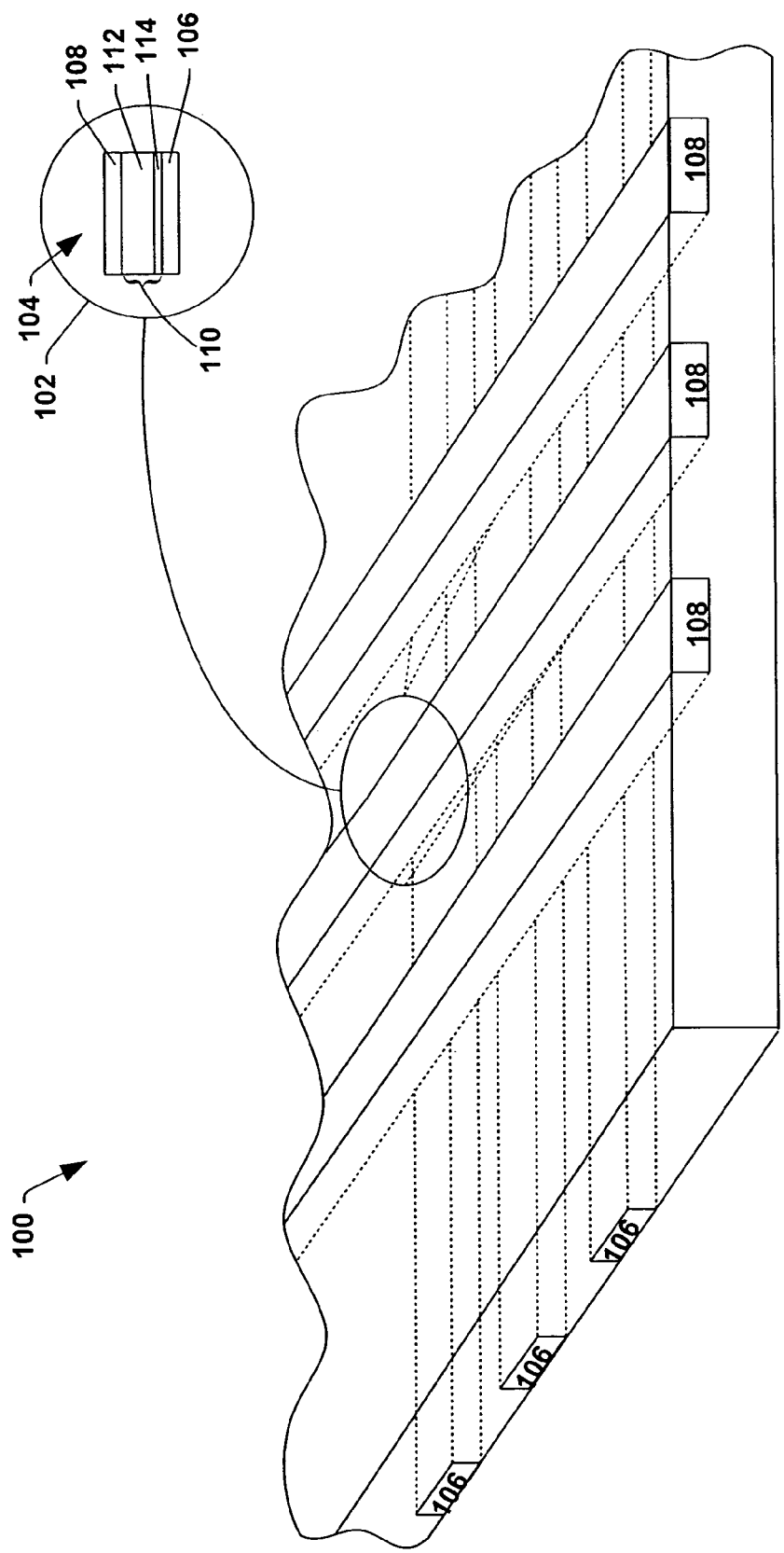
FIG. 1 illustrates a perspective view of a three dimensional microelectronic device containing a plurality of memory cells in accordance with one aspect of the invention.

The present invention involves forming copper sulfide regions or layers over a substrate containing at least copper by contacting a sulfide compound with the structure and contacting a copper vapor precursor with the substrate to form the copper sulfide layer. The substrate comprises at least copper, so as to permit formation of a copper sulfide layer by a sulfide treatment. The process cycle that includes contacting the sulfide compound with the substrate and contacting the copper vapor precursor with the substrate may be repeated for a given number of cycles necessary for forming the copper sulfide layer on the substrate.

The present invention also involves forming copper sulfide regions or layers in memory cells by contacting a sulfide compound with a first electrode containing at least copper and contacting a copper vapor precursor with the first electrode to form the copper sulfide layer. The copper sulfide layer formation process in accordance with the present invention does not result in depletion of elemental copper from the first electrode and undesirable, uncontrollable void formation. Since the depletion and void formation could have a negative impact on the quality of the manufactured chip by altering the desired electrical properties of and interactions between components on the manufactured chip, nonoccurrence of these deficiencies in accordance with the present invention is a significant advance.

The memory cells contain at least two electrodes, as one or more electrodes may be deposited between the two electrodes that sandwich the controllably conductive media. The electrodes are made of conductive material, such as conductive metal, conductive metal alloys, conductive metal oxides, conductive polymer films, semiconductive materials, and the like. However, the electrode that is adjacent to the copper sulfide layer contains at least copper, so as to permit formation of a copper sulfide layer by a sulfur treatment. In one embodiment, the electrode that is adjacent to the copper sulfide layer contains at least 50% by weight copper.

Generally speaking, a copper sulfide layer is formed over a substrate or in memory structure by initially and optionally removing or reducing copper oxide that be present on the structure containing at least copper. By removing or reducing copper oxide if present, uniformity in the thickness of the thin layer and the adhesion between the subsequently formed copper sulfide region and the active layer is improved. Moreover, removing copper oxide if present facilitates the formation of a copper sulfide layer with the exposed or upper regions of the structure containing at least copper.

After optional copper oxide removal/reduction, a sulfide compound is contacted with the structure containing at least copper in a portion of the structure and then a copper vapor precursor is contacted with the substrate to form the copper sulfide layer. A mask such as a patterned photoresist may cover portions of the surface of the structure containing at least copper, thus limiting copper sulfide formation to the exposed portions of the structure. Alternatively, the copper portions of the substrate can be formed by the well-known damascene process, in which features that are etched into an insulating dielectric are subsequently filled with copper and polished to selectively remove the excess copper along the top lateral surfaces. A process cycle for forming the copper sulfide layer on the substrate includes contacting a sulfide compound with the substrate and contacting a copper vapor precursor with the substrate. The thickness of the copper sulfide region on the structure depends upon a number of factors including the length of time that the sulfide compound and the copper vapor precursor are in contact with the structure, the number of the process cycles, the temperature, the concentration of the sulfide compound in the processing chamber, and the like.

It is noted that the term copper sulfide layer or region on a substrate refers to a layer or region that contains $Cu_xS_y$. It is also noted that the term copper sulfide layer or region in a memory cell refers to a portion of a memory element or memory cell that contains $Cu_xS_y$, as a conductivity-facilitating compound. In one embodiment, x and y are independently from about 0.5 to about 9. In another embodiment, x and y are independently from about 1 to about 2. Common examples of $Cu_xS_y$ compounds include $Cu_2S_3$, CuS, $Cu_{1.5}S$, $Cu_2S$, $Cu_9S_5$, $Cu_3S$, and the like. For simplicity and brevity, all such copper sulfide layers falling within the noted $Cu_xS_y$ formula are generically referred to as copper sulfide layers. To improve efficiency of the overall process, both copper oxide removal/reduction and copper sulfide formation can be conducted in the same processing chamber. Alternatively, different chambers may be employed for the copper oxide removal/reduction and copper sulfide formation, provide that no oxygen is present as the substrate is transferred from one chamber to the other.

Referring to FIG. 1, a brief description of a microelectronic memory device 100 containing a plurality of memory cells in accordance with one aspect of the invention is shown, as well as an exploded view 102 of an exemplary memory cell 104. The microelectronic memory device 100 contains a desired number of memory cells, as determined by the number of rows, columns, and layers (three dimensional orientation described later) present. The first electrodes 106 and the second electrodes 108 are shown in substantially perpendicular orientation, although other orientations are possible to achieve the structure of the exploded view 102. Each memory cell 104 contains a first electrode 106 and a second electrode 108 with a controllably conductive media 110 therebetween. The controllably conductive media 110 contains an active layer 112 and passive layer 114. Peripheral circuitry and devices are not shown for brevity.

The memory cells contain at least two electrodes 106, 108, as one or more electrodes may be deposited between the two electrodes that sandwich the controllably conductive media 110. The electrodes are made of conductive material, such as conductive metal, conductive metal alloys, conductive metal oxides, conductive polymer films, semiconductive materials, and the like.

Examples of electrodes include one or more of aluminum, chromium, cobalt, copper, germanium, gold, magnesium, manganese, molybdenum, indium, iron, nickel, palladium, platinum, samarium, silver, titanium, tungsten, zinc, and alloys thereof; indium-tin oxide (ITO) and indium zinc oxide and other conductive metal oxides; polysilicon; doped amorphous silicon; metal silicides, metal carbides, and metal nitrides; and the like. Alloy electrodes specifically include Hastelloy®, Kovar®, Invar®, Monel®, Inconel®, brass, stainless steel, magnesium-silver alloy, and various other alloys.

However, the first electrode 106 that is adjacent to the copper sulfide layer 114 contains at least copper, so as to permit formation of a copper sulfide layer 114 by a copper sulfide formation process. In one embodiment, the electrode that is adjacent to the copper sulfide layer contains at least 50% by weight copper.

In one embodiment, the thickness of each electrode 106, 108 is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

The controllably conductive media 110, placed between the two electrodes 106, 108, can be rendered conductive or non-conductive in a controllable manner using an external stimulus. Generally, in the absence of an external stimulus, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, and a semiconductive state.

The controllably conductive media 110 can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media 110 contains one or more active layers 112 and one or more passive layers 114. In one embodiment, the controllably conductive media contains at least one active layer 112 that is adjacent to a passive layer 114 (without any intermediary layers between the active layer and passive layer).

The active layer 112 of the present invention can be formed using any suitable low conducting material. Examples of materials that can be used in the formation of the active layer 112 include organic semiconductor materials, inorganic semiconductor materials, and mixtures of organic and inorganic semiconductor materials. The active layer 112 can be formed using techniques well known to a person in the art.

General examples of the low conducting inorganic materials include transition metal sulfides, chalcogenides, and transition metal oxides. Some of the examples of low conducting materials may have high conductivity, such as $Cu_2S$. Examples of inorganic materials include copper oxide ($CuO$, $Cu_2O$), iron oxide ($FeO$, $Fe_3O_4$), manganese oxide ($MnO_2$, $Mn_2O_3$, etc), and titanium oxide ($TiO_2$).

General examples of the organic semiconductor materials include at least one of an organic material (such as a conjugated organic monomer, oligomer, or polymer), an organometallic compound (such as a conjugated organometallic compound), an organometallic material (such as a conjugated organometallic monomer, oligomer, or polymer), a Buckyball, a carbon nanotube (such as a C6–C60 carbon nanotubes), and the like.

The active layer can also contain a mixture of organic and inorganic materials. The inorganic material is usually embedded in an organic semiconductor material. The inorganic component of the active layer may be metal either in ionic or elemental form, or in both. For example, $Cu^+$ may be present in the organic material component of the active layer, either by fabrication or by diffusion under electric field. This Cu+ may be reduced to elemental Cu by the programming current. The inorganic component of the active layer may be metal oxide/sulfide. Examples of active layer containing a mixture of organic and inorganic materials include polyphenylacetylene mixed with $Cu_2S$, polyphenylacetylene mixed with $Cu_2O$, and the like. Hereinafter, the present invention is described using an organic semiconductor layer containing organic semiconductor materials as an exemplary active layer 112.

The organic semiconductor materials have a carbon-based structure, often a carbon-hydrogen based structure. The organic semiconductor materials are typically characterized in that they have overlapping p orbitals, and/or in that they have at least two stable oxidation states. The organic semiconductor materials are also characterized in that they may assume two or more resonant structures. The overlapping p orbitals contribute to the controllably conductive properties of the controllably conductive media. The amount of charge injected into the active layer also influences the degree of conductivity of the active layer.

A carbon nanotube is typically a hexagonal network of carbon atoms (from about 6 to about 60 carbon atoms, typically) that is rolled up into a seamless cylinder. Each end may be capped with half of a Fullerene molecule. Carbon nanotubes may be prepared by the laser vaporization of a carbon target (a cobalt-nickel catalyst may facilitate growth) or a carbon-arc method to grow similar arrays of single-wall nanotubes. A Buckyball is more specifically a Buckminster-fullerene, a soccer ball-shaped 60-atom cluster of pure carbon.

The organic polymer typically contains a conjugated organic polymer. The conjugated organic polymer may be linear or branched, so long as the polymer retains its conjugated nature. Conjugated polymers are characterized in that they have overlapping p orbitals. Conjugated polymers are also characterized in that they may assume two or more resonant structures. The conjugated nature of the conjugated organic polymer contributes to the controllably conductive properties of the controllably conductive media.

In this connection, the active layer 112, such as the conjugated organic polymer, has the ability to donate and accept charges (holes and/or electrons). Generally, the organic semiconductor or an atom/moiety in the polymer has at least two relatively stable oxidation states. The two relatively stable oxidation states permit the organic semiconductor to donate and accept charges and electrically interact with the conductivity-facilitating compound. The ability of the active layer to donate and accept charges and electrically interact with the passive layer also depends on the identity of the conductivity-facilitating compound.

Organic semiconductors generally include polymers with variable electric conductivity. In one embodiment, the organic semiconductor contains a conjugated organic polymer. In another embodiment, the organic semiconductor contains a conjugated organic polymer with an aromatic group within its repeating unit. The conjugated organic polymer may be linear or branched, so long as the polymer retains its conjugated nature.

In yet another embodiment, the organic semiconductor contains an organometallic polymer (such as a conjugated organometallic polymer), or carbon structures such as carbon nanotubes and Buckyballs. A carbon nanotube is typically a hexagonal network of carbon atoms that is rolled up into a seamless cylinder. Each end may be capped with half of a Fullerene molecule. Carbon nanotubes may be prepared by the laser vaporization of a carbon target (a cobalt-nickel catalyst may facilitate growth) or a carbon-arc method to grow similar arrays of single wall nanotubes. A Buckyball is more specifically a Buckminster-fullerene, a soccer ball shaped 60-atom or 70-atom cluster of pure carbon.

Examples of polymers with variable electrical conductivity include polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly (trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

In one embodiment, the active layer 112 is not doped with a salt. In another embodiment, the active layer 112 is doped with a salt. A salt is an ionic compound having an anion and cation. General examples of salts that can be employed to dope the active layer 112 include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

In one embodiment, the active layer 112 has a thickness of about 0.001 μm or more and about 5 μm or less. In another embodiment, the active layer 112 has a thickness of about 0.01 μm or more and about 2.5 μm or less. In yet another embodiment, the active layer 112 has a thickness of about 0.05 μm or more and about 1 μm or less.

In one embodiment, the active layer 112 contains a thin layer designed to improve or lengthen charge retention time. The thin layer may be placed anywhere within the active layer 112, but typically near the middle of the layer. The thin layer contains any of the electrode materials or the compounds of the below-described heterocyclic/aromatic compound layer. In one embodiment, the thin layer has a thickness of about 50 Å or more and about 0.1 μm or less. In another embodiment, the thin layer has a thickness of about 100 Å or more and about 0.05 μm or less. For example, a memory cell may contain a first electrode of copper, a passive layer of copper sulfide, an active layer of poly(phenylene vinylene), and a second electrode of aluminum, wherein the poly(phenylene vinylene) active layer contains a 250 Å thick layer of copper therein.

In one embodiment, the organic semiconductor material does not contain an organometallic compound. In another embodiment, the organic semiconductor material contains an organic polymer doped with an organometallic compound. In yet another embodiment, the memory cells optionally contain an organometallic compound layer. In still yet another embodiment, the organic semiconductor material contains an organometallic compound.

The active layer 112 may be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). During formation or deposition, the organic semiconductor material self assembles between the electrodes. It is not typically necessary to functionalize one or more ends of the organic polymer in order to attach it to an electrode/passive layer.

A covalent bond may be formed between the organic semiconductor material 112 and the passive layer 114. Alternatively, close contact is required to provide good charge carrier/electron exchange between the active layer and the passive layer. The active layer 112 and the passive layer 114 are electrically coupled in that charge carrier/electron exchange occurs between the two layers.

A passive layer 114 contains at least one conductivity-facilitating compound that contributes to the controllably conductive properties of the controllably conductive media. The conductivity-facilitating compound has the ability to donate and accept charges carriers (holes, electrons, and/or ions). The passive layer 114 thus may transport between an electrode and the organic polymer layer/passive layer interface, facilitate charge/carrier injection into the organic polymer layer, and/or increase the concentration of a charge carrier in the organic polymer layer. In some instances, the passive layer 114 may store opposite charges thereby providing a balance of charges in the memory device as a whole. Storing charges/charge carriers is facilitated by the existence of two relatively stable oxidation states for the conductivity-facilitating compound.

Generally, the conductivity-facilitating compound or an atom in the conductivity-facilitating compound has at least two relatively stable oxidation states. The two relatively stable oxidation states permit the conductivity-facilitating compound to donate and accept charges and electrically interact with the active layer. The particular conductivity-facilitating compound employed in a given memory cell is selected so that the two relatively stable oxidation states match with the two relatively stable oxidation states of the organic semiconductor material. Matching the energy bands of two relatively stable oxidation states of the organic semiconductor material and the conductivity-facilitating compound facilitate charge carrier retention in the active layer.

Matching energy bands means that the Fermi level of the passive layer is close to the valence band of the active layer. Consequently, the injected charge carrier (into the active layer) may recombine with the charge at the passive layer if the energy band of the charged active layer does not substantially change. Matching energy bands involves compromising between ease of charge injection and length of charge (data) retention time.

The applied external field can reduce the energy barrier between passive layer and active layer depending on the field direction. Therefore, enhanced charge injection in the forward direction field in programming operation and also enhanced charge recombination in reversed field in erase operation can be obtained.

The copper sulfide passive layer may in some instances act as a catalyst when forming the active layer, particularly when the active layer contains a conjugated organic polymer. In this connection, the polymer backbone of the conjugated organic polymer may initially form adjacent the passive layer, and grow or assemble away and substantially perpendicular to the passive layer surface. As a result, the polymer backbones of the conjugated organic polymers are self-aligned in a direction that traverses the two electrodes.

An example of the conductivity-facilitating compound that may constitute at least a portion of the passive layer is copper sulfide. The conductivity-facilitating compound does not dissociate into ions under the strength of the electric field. The passive layer may contain two or more sub-passive layers.

The passive layer containing copper sulfide is formed in the following manner. A copper sulfide passive region is formed in a memory structure by initially and optionally removing or reducing copper oxide that be present on the structure containing at least copper. The copper oxide structure may be a copper electrode or a copper pad within an electrode, the electrode with a copper pad or copper electrode adjacent to the subsequently formed copper sulfide passive layer.

Copper oxide removal or reduction, if performed, is carried out in any suitable manner. For example, the structure containing the copper oxide on the structure surface may be heated at sufficient temperature and for a sufficient period of time to facilitate oxide removal/reduction. When heating the structure containing the copper oxide, the atmosphere contains one or more inert gases, with or without ammonia, and preferably consists essentially of one or more inert gases. In this connection, in one embodiment, when heating the structure containing the copper oxide, the atmosphere contains essentially a nitrogen gas.

In one embodiment, the structure containing the copper oxide on the structure surface is heated from about 200° C. to about 500° C. In another embodiment, the structure containing the copper oxide is heated from about 300° C. to about 475° C. In yet another embodiment, the structure containing the copper oxide is heated from about 350° C. to about 450° C. In one embodiment, the structure containing the copper oxide is heated for a time from about 1 second to about 3 minutes. In another embodiment, the structure containing the copper oxide is heated for a time from about 2 seconds to about 2 minutes. In yet another embodiment, the structure containing the copper oxide is heated for a time from about 3 seconds to about 1 minute.

After optional copper oxide removal/reduction, a sulfide compound is contacted with the structure containing at least copper to form a copper-sulfur bond on the surface of the structure. The copper-sulfur bond may be formed over the entire surface of the structure containing at least copper, or a mask such as a patterned photoresist may cover portions of the surface of the structure, thus limiting copper sulfide formation to the portions of the structure exposed through the openings in the mask.

The sulfide compound is capable of reacting with copper to form a copper-sulfur bond within or on the original structure containing at least copper. For example, the sulfide compound may be a compound having the general formula of $R_2S$, wherein each R is independently a Group IA element or an organic group. General examples of sulfide compounds containing Group IA elements include hydrogen sulfide, lithium sulfide, sodium sulfide, potassium sulfide, lithium thiol, sodium thiol, potassium thiol, and the like.

The sulfide compound may have a general formula of $R_2S$, wherein each R may contain an organic group. The organic group may contain at least one aliphatic or aromatic organic moiety having from about 1 to about 100 carbon atoms which may include one or more oxygen, sulfur, or nitrogen, or fluorine atoms, wherein the aliphatic chain may be linear, branched, saturated or unsaturated, and wherein either the aliphatic chain or the aromatic ring may have substituted groups thereon. General examples of organic group may include from about 1 to about 100 carbon atoms including at least one from the group consisting of alkyl, acryloxy, heterocyclic, amino, amide, vinyl, epoxy, glycidoxy, mercapto, siloxy, halocarbon, a carbon—carbon double bond containing group, and a carbon—carbon triple bond containing group. Non-limiting examples of organic group may include alkyl sulfide alkylthiol such as methanethiol, ethanethiol, propanethiol, butanethiol, hexanethiol, pentanethiol, amylthiol, and dodecylthiol; haloalkyl sulfide such as fluoromethylthio, chloromethylthio, trifluoromethylthio, difluoromethylthio, trifluoroethylthio, fluoroethylthio, tetrafluoroethylthio, pentafluoroethylthio, and fluoropropylthio; metal salt (e.g., lithium, sodium) of alkylthiol such as lithium methylthiolate, sodium methylthiolate, sodium ethylthiolate, lithium n-propylthiolate, lithium n-butylthiolate, chloromagnesium phenylthiolate, dilithium ethane dithiolate, and dichloroaluminum propylthiolate; alkenyl sulfide such as $C_2$ to $C_{20}$ alkenyl sulfide; mercaptoalkanols such as mercaptoethanol, mercaptopropanol, and mercaptobutanol; thiocarboxylate such as ethanethioic acid, propanothioic acid, butanethioic acid and pentathioic acid as well as their esters with aliphatic $C_1$ to $C_{20}$ alcohols; cyclohexanethiol; heterocyclethiol such as pyridinethiol, pyrimidinethiol, and methylpyridazinethiol; arylthiol such as thiophenol, benzenethiol and toluenethiol, substituted arylthiols such as o-aminophenylthiol, p-chlorophenylthiol, p-bromophenyltbiol, dichloro-benzenethiols, 3-(3-thiophenyl)propionic acid, 3-(2,4-dimethyl-3-thiophenyl)propionic acid, and the correspondingly substituted toluenethiols; polythiol compounds such as methanedithiol, 1,2-ethanedithiol, 1,1-propanedithiol, 1,2-propanedithiol, 1,3-propanedithiol, 2,2-propanedithiol, 1,6-hexanedithiol, 1,2,3-propanetrithiol, tetrakis(mercaptomethyl)methane, 1,1-cyclohexanedithiol, 1,2-cyclohexanedithiol, 2,2dimethylpropane-1,3-dithiol, 3,4-dimethoxybutane-1,2-dithiol, 2-methylcyclohexane-2,3-dithiol, and 1,1-bis(mercaptomethyl)cyclohexane; and the like. These illustrative compounds may have side chains or functional groups, thus they may be substituted or unsubstituted.

The sulfide compound is contacted with the structure containing at least copper in the form of a sulfide compound mixture. The sulfide compound mixture contains one or more sulfide compounds and may contain one or more inert gases. Inert gases include nitrogen, and the noble gases, which include argon, helium, neon, krypton, and xenon. The sulfide compound mixture may be in the form of a gas, a plasma, or a combination of a gas and plasma.

The sulfide compound mixture is contacted with the structure containing at least copper, the sulfide compound mixture having a sulfide compound concentration sufficient to facilitate formation of a copper-sulfur bond in a portion of the structure. In one embodiment, the sulfide compound mixture contains from about 0.1% to about 100% by weight of at least one sulfide compound and from about 0% to about 99.9% by weight of at least one inert gas. In another embodiment, the sulfide compound mixture contains from about 0.5% to about 20% by weight of at least one sulfide compound and from about 80% to about 99.5% by weight of at least one inert gas. In yet another embodiment, the sulfide compound mixture contains from about 1% to about 10% by weight of at least one sulfide compound and from about 90% to about 99% by weight of at least one inert gas. For example, the sulfide compound mixture may contain about 2% by weight of at least one sulfide compound and about 98% by weight of at least one inert gas, about 5% by weight of at least one sulfide compound and about 95% by weight of at least one inert gas, or about 10% by weight of at least one sulfide compound and about 90% by weight of at least one inert gas.

The sulfide compound is contacted with the structure containing at least copper for a time sufficient to facilitate formation of copper-sulfur bond in a portion of the structure. In one embodiment, the sulfide compound is contacted with the structure containing at least copper for a time from about 1 second to about 60 minutes. In another embodiment, the sulfide compound is contacted with the structure containing at least copper for a time from about 1 minute to about 40 minutes. In yet another embodiment, the sulfide compound is contacted with the structure containing at least copper for a time from about 3 minute to about 30 minutes. The chamber in which the sulfide compound is contacted with the structure containing at least copper may be equipped with a mass flow controller.

The sulfide compound is contacted with the structure containing at least copper at a temperature sufficient to facilitate formation of a copper-sulfur bond in a portion of the structure containing at least copper. In one embodiment, the sulfide compound is contacted with the structure containing at least copper at a temperature from about 15° C. to about 500° C. In another embodiment, the sulfide compound is contacted with the structure containing at least copper at a temperature from about 20° C. to about 300° C. In yet another embodiment, the sulfide compound is contacted with the structure containing at least copper at a temperature from about 50° C. to about 200° C.

The sulfide compound is contacted with the structure containing at least copper at a pressure sufficient to facilitate formation of copper-sulfur bond in a portion of the structure. In one embodiment, the sulfide compound is contacted with the structure containing at least copper at a pressure from about 0.0001 Torr to about 1,000 Torr. In another embodiment, the sulfide compound is contacted with the structure containing at least copper at a pressure from about 0.001 Torr to about 500 Torr. In yet another embodiment, the sulfide compound is contacted with the structure containing at least copper at a pressure from about 0.01 Torr to about 100 Torr.

After contacting the sulfide compound with the substrate containing at least copper and forming copper-sulfur bonds in a portion of the structure, a copper vapor precursor is contacted with the substrate to form the copper sulfide layer. By contacting the copper vapor precursor with the substrate, the additional copper-sulfur bond is formed between a copper element of the copper vapor precursor and the sulfur element that was previously attached to the portion of the structure.

The copper vapor precursor may be any copper vapor precursors that are capable of reacting with sulfide compound to form the additional copper-sulfur bonds. For example, any known vaporizable copper compound may be employed. Typically used vaporizable copper compound include RCu(hfac), where hfac=hexafluoroacetylacetonate, such as 1,5-dimethyl 1,5-cyclooctadiene copper(I) hexafluoroacetylacetonate, 1,6-dimethyl 1,5-cyclooctadiene copper (I) hexafluoroacetylacetonate ((DMCOD)Cu(hfac)), hexyne copper(I) hexafluoroacetylacetonate ((HYN)Cu(hfac)), butyne copper(I) hexafluoroacetylacetonate ((BUY)Cu(hfac)), copper (I) trimethylvinylsilyl-hexafluoroacethylacetonato (Cu(hfac)TMVS), copper (I), copper(I) bis(trimethylsilyl)acetylene-hexafluoroacethylacetonato, copper (I) triethoxyvinylsilane-hexafluoroacethylacetonato, copper (I) trimethylallylsilane-hexafluoroacethylacetonato, and the like. Non-limiting other examples of copper vapor precursor include a copper halide, copper acetyl acetonate, copper tetramethyl heptanedionate (TMHD) or cyclopentadienyl-copper-trialkylphosphine, t-butoxy-copper-t-butyldifluorophosphane, t-butoxy-copper-phenyldifluorophosphane, t-butoxy-copper-diethylaminodifluorophosphane, 2-trifluoromethylpropane-2-oxy-copper-t-butylisonitrile, 2-trifluoromethylpropane-2-oxy-copper-trimethylphosphane, perfluoro-t-butoxy-copper-t-butylisonitrile, and perfluoro-t-butoxy-copper-trimethylphosphane, $C_5H_5$—Cu-t-BuNC, and derivatives thereof (e.g., hexafluoro acetyl acetonate copper), and the like. These illustrative compounds may have side chains or functional groups, thus they may be substituted or unsubstituted.

The copper vapor precursor is contacted with the structure in the form of a copper vapor precursor mixture. The copper vapor precursor mixture contains one or more copper vapor precursors and may contain one or more inert gases. Inert gases include nitrogen, and the noble gases, which include argon, helium, neon, krypton, and xenon. The copper vapor precursor may be in the form of a gas, a plasma, or a combination of a gas and plasma.

The copper vapor precursor mixture is contacted with the structure containing at least copper, the copper vapor precursor mixture having a sufficient concentration of copper vapor precursor to facilitate formation of the copper-sulfur bond in a portion of the structure. In one embodiment, the copper vapor precursor mixture contains from about 0.1% to about 100% by weight of at least one copper vapor precursor and from about 0% to about 99.9% by weight of at least one inert gas. In another embodiment, the copper vapor precursor mixture contains from about 0.5% to about 20% by weight of at least one copper vapor precursor and from about 80% to about 99.5% by weight of at least one inert gas. In yet another embodiment, the copper vapor precursor mixture contains from about 1% to about 10% by weight of at least one copper vapor precursor and from about 90% to about 99% by weight of at least one inert gas. For example, the copper vapor precursor mixture may contain about 2% by weight of at least one copper vapor precursor and about 98% by weight of at least one inert gas, about 5% by weight of at least one copper vapor precursor and about 95% by weight of at least one inert gas, or about 10% by weight of at least one copper vapor precursor and about 90% by weight of at least one inert gas.

The copper vapor precursor is contacted with the structure containing at least copper for a time sufficient to facilitate formation of the copper-sulfur bond in a portion of the structure. In one embodiment, the copper vapor precursor is contacted with the structure containing at least copper for a time from about 1 second to about 60 minutes. In another embodiment, the copper vapor precursor is contacted with the structure containing at least copper for a time from about 1 minute to about 40 minutes. In yet another embodiment, the copper vapor precursor is contacted with the structure containing at least copper for a time from about 3 minute to about 30 minutes. The chamber in which the copper vapor precursor is contacted with the structure containing at least copper may be equipped with a mass flow controller.

The copper vapor precursor is contacted with the structure containing at least copper at a temperature sufficient to facilitate formation of the copper-sulfur bond in a portion of the structure containing at least copper. In one embodiment, the copper vapor precursor is contacted with the structure containing at least copper at a temperature from about 15° C. to about 500° C. In another embodiment, the copper vapor precursor is contacted with the structure containing at least copper at a temperature from about 20° C. to about 300° C. In yet another embodiment, the copper vapor precursor is contacted with the structure containing at least copper at a temperature from about 50° C. to about 200° C.

The copper vapor precursor is contacted with the structure containing at least copper at a pressure sufficient to facilitate formation of copper-sulfur bond in a portion of the structure. In one embodiment, the copper vapor precursor is contacted with the structure containing at least copper at a pressure from about 0.0001 Torr to about 1,000 Torr. In another embodiment, the copper vapor precursor is contacted with the structure containing at least copper at a pressure from about 0.001 Torr to about 500 Torr. In yet another embodiment, the copper vapor precursor is contacted with the structure containing at least copper at a pressure from about 0.01 Torr to about 100 Torr.

The process cycle including contacting the sulfide compound with the substrate and contacting the copper vapor precursor with the substrate may be repeated for a given number of cycles necessary for forming the copper sulfide layer on the substrate. Generally speaking, the thickness of the copper sulfide layer on the structure may be proportional to the number of cycles performed. Accordingly, the thickness of the copper sulfide layer can be controlled by the number of cycles. In one embodiment, the copper sulfide formation process cycles may be performed from about 5 times to about 1000 times. In one embodiment, the copper sulfide formation process cycles may be performed from about 20 times to about 700 times. In one embodiment, the copper sulfide formation process cycles may be performed from about 50 times to about 500 times.

In some instances, to promote long charge retention times (in the active layer), the passive layer may be treated with a plasma after it is formed. The plasma treatment, which may contain an inert gas, modifies the energy barrier of the passive layer.

In order to facilitate operation of the memory cells, the active layer is thicker than the passive layer. In one embodiment, the thickness of the active layer is from about 10 to about 500 times greater than the thickness of the passive layer. In another embodiment, the thickness of the active layer is from about 25 to about 250 times greater than the thickness of the passive layer.

The area of the individual memory cells (as measured by the surface area of the two electrodes directly overlapping each other) can be small compared to conventional silicon based inorganic memory cells such as metal oxide semiconductor field effect transistors (MOSFETs). In one embodiment, the area of the memory cells of the present invention is about 0.0001 $\mu m^2$ or more and about 4 $\mu m^2$ or less. In another embodiment, the area of the memory cells is about 0.001 $\mu m$ 2 or more and about 1 $\mu m^2$ or less.

Operation of the memory devices/cells is facilitated using an external stimulus to achieve a switching effect. The external stimuli include an external electric field and/or light radiation. Under various conditions, the memory cell is either conductive (low impedance or "on" state) or non-conductive (high impedance or "off" state).

The memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single memory cell, such as 2 or more bits of information or 4 or more bits of information.

Switching the memory cell to the "on" state from the "off" state occurs when an external stimulus such as an applied electric field exceeds a threshold value. Switching the memory cell to the "off" state from the "on" state occurs when an external stimulus does not exceed a threshold value or does not exist. After programming as described, the cell in the "on" state maintains its low impedance or "on" state even after the programming field is removed. To erase the cell a field is applied in the opposite direction, which switches the cell "off" or into a high impedance state. The threshold value varies depending upon a number of factors including the identity of the materials that constitute the memory cell and the passive layer, the thickness of the various layers, and the like.

Generally speaking, the presence of an external stimulus such as an applied electric field that exceeds a threshold value ("on" state) permits an applied voltage to write or erase information into/from the memory cell and the presence of an external stimulus such as an applied electric field that is less than a threshold value permits an applied voltage to read information from the memory cell; whereas the absence of the external stimuli that exceeds a threshold value ("off" state) prevents an applied voltage to write or erase information into/from the memory cell.

To write information into the memory cell, a voltage or pulse signal that exceeds the threshold is applied. To read information written into the memory cell, a voltage or electric field of any polarity is applied. Measuring the impedance determines whether the memory cell is in a low impedance state or a high impedance state (and thus whether it is "on" or "off"). To erase information written into the memory cell, a negative voltage or a polarity opposite the polarity of the writing signal that exceeds a threshold value is applied.

The memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The memory devices may be fabricated in planar orientation (two dimensional) or three-dimensional orientation containing at least two planar arrays of the memory cells.

Figure 2:
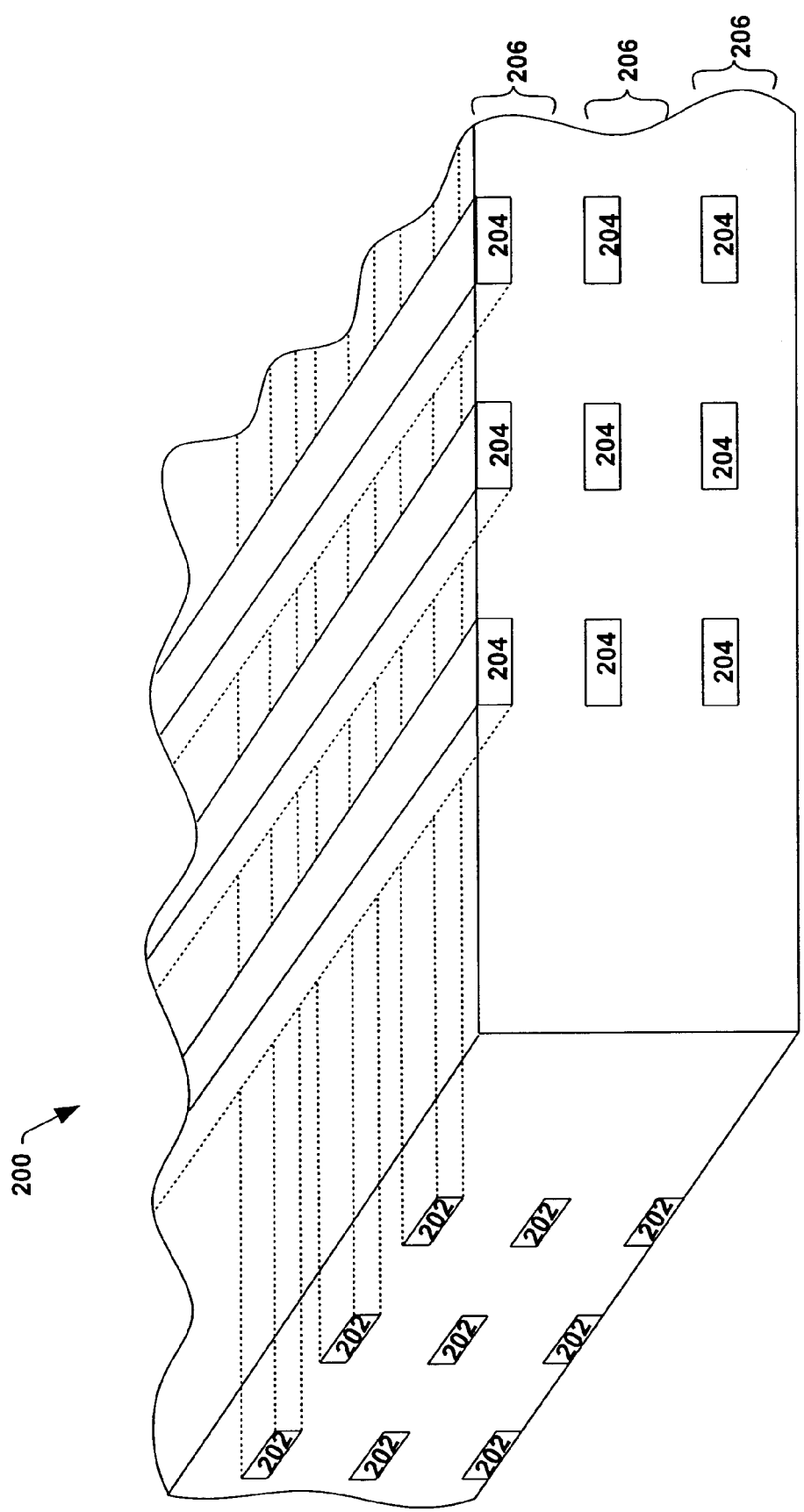
FIG. 2 illustrates a perspective view of a three dimensional microelectronic device containing a plurality of memory cells in accordance with another aspect of the invention.
Figure 3:
FIG. 3 shows a cross sectional view of forming a copper sulfide region in accordance with one aspect of the invention.

Referring to FIG. 2, a three-dimensional microelectronic memory device 200 containing a plurality of memory cells in accordance with an aspect of the invention is shown. The three-dimensional microelectronic memory device 200 contains a plurality of first electrodes 202, a plurality of second electrodes 204, and a plurality of memory cell layers 206. Between the respective first and second electrodes are the controllably conductive media (not shown). The plurality of first electrodes 202 and the plurality of second electrodes 204 are shown in substantially perpendicular orientation, although other orientations are possible. The three-dimensional microelectronic memory device is capable of containing an extremely high number of memory cells thereby improving device density. Peripheral circuitry and devices are not shown for brevity.

The impedance of the controllably conductive media changes when an external stimulus such as an applied electric field is imposed. A plurality of memory cells, which may be referred to as an array, forms a memory device. In this connection, memory cells may form a memory devices and function in a manner analogous to MOSFETs in conventional semiconductor memory devices.

Referring to FIGS. 3 to 6 and FIGS. 7 to 10, two of many possible exemplary embodiments of forming a passive region of copper sulfide are illustrated. Specifically referring to FIG. 3, an electrode 300 containing at least copper is provided. The electrode 300 may be a layer of copper or a copper alloy layer.

Figure 4:
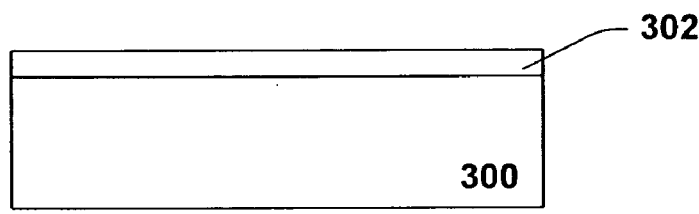
FIG. 4 shows a cross sectional view of forming a copper sulfide region in accordance with one aspect of the invention.

Referring to FIG. 4, a copper oxide layer 302 may form over the electrode 300 containing copper. Often times, the thickness of the copper oxide layer 302 is a function of time when the electrode 300 containing copper is exposed to the ambient atmosphere. That is, oxygen normally present in air can oxidize the surface of a copper or copper alloy metal.

Figure 5:
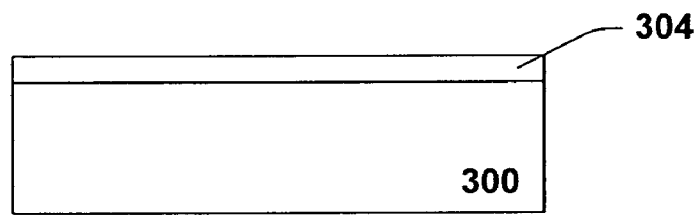
FIG. 5 shows a cross sectional view of forming a copper sulfide region in accordance with one aspect of the invention.

Referring to FIG. 5, the structure is heated to a temperature from about 200° C. to about 500° C. for a time from about 1 second to about 3 minutes to remove the copper oxide layer 302 from the electrode 300 containing copper. For example, the structure is heated to a temperature of about 400° C. for 15 seconds in a gas atmosphere containing essentially of $N_2$ to remove the copper oxide layer 302 from the electrode 300 containing copper. After the copper oxide layer 302 is removed, within the same chamber a sulfide compound mixture containing at least one sulfide compound and at least one inert gas is contacted with the electrode 300 for a time from about 1 second to about 60 minutes at a temperature from about 15° C. to about 500° C. to form copper-sulfur bonds within the electrode 300. For example, a mixture containing essentially about 10% by weight of hydrogen sulfide and about 90% by weight of nitrogen is contacted with the electrode 300 for about 20 minutes at a temperature of about 50° C. to form copper-sulfur bonds.

After contacting the sulfide compound mixture with the electrode 300 and forming copper-sulfur bonds within the electrode 300, within the same chamber a copper vapor precursor mixture is contacted with the substrate to form the copper sulfide layer. The copper vapor precursor mixture containing at least one copper vapor precursor and at least one inert gas is contacted with the electrode 300 for a time from about 1 second to about 60 minutes at a temperature from about 15° C. to about 500° C. to form copper sulfide layer 304. For example, a mixture containing essentially about 5% by weight of Cu(hfac)TMVS and about 95% by weight of nitrogen is contacted with the electrode 300 for about 20 minutes at a temperature of about 50° C. to form a copper sulfide layer 304.

The process cycle including contacting the sulfide compound mixture with the electrode 300 and contacting the copper vapor precursor mixture with the electrode 300 may be repeated for a given number of cycles necessary for forming the copper sulfide layer 304 on the electrode 300. For example, the copper sulfide layer formation process cycle is performed about 100 times. In this example, the copper sulfide layer has a thickness of about 250 Å.

The copper oxide reduction/removal is optional in the sense that the copper sulfide region may be formed in the electrode 300 containing copper before copper oxide forms on the electrode 300 surface.

Figure 6:
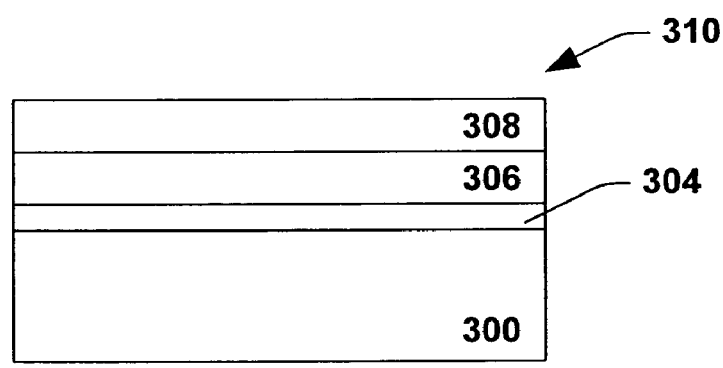
FIG. 6 shows a cross sectional view of forming a memory cell in accordance with one aspect of the invention.

Referring to FIG. 6, an active layer 306 containing an organic semiconductor such as polyphenylacetylene is formed over the copper sulfide region 304 using CVD techniques. Another electrode 308 is formed over the active layer 306 to provide a memory cell 310. In this example, the electrode 308 contains aluminum.

Figure 7:
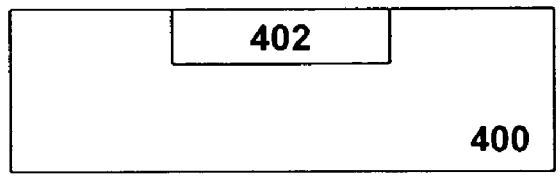
FIG. 7 shows a cross sectional view of forming a copper sulfide region in accordance with one aspect of the invention.

Referring to FIG. 7, a structure 400 containing a copper pad 402 is provided. The structure 400 may be a dielectric layer.

Figure 8:
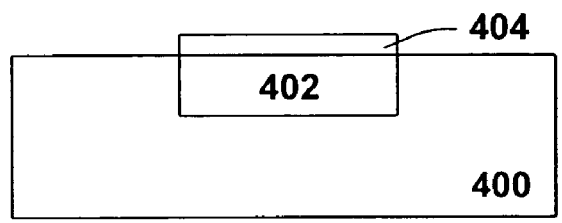
FIG. 8 shows a cross sectional view of forming a copper sulfide region in accordance with one aspect of the invention.

Referring to FIG. 8, a copper oxide layer 404 may form over the copper pad 402. Often times, the thickness of the copper oxide layer 404 is a function of time when the copper pad 402 is exposed to the ambient atmosphere. That is, oxygen normally present in air can oxidize the surface of a copper or copper alloy metal.

Figure 9:
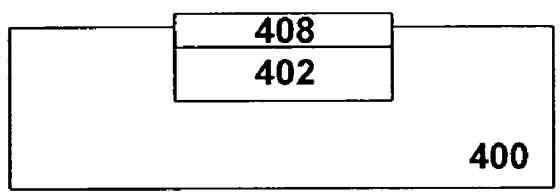
FIG. 9 shows a cross sectional view of forming a copper sulfide region in accordance with one aspect of the invention.

Referring to FIG. 9, the structure is heated to a temperature from about 200° C. to about 500° C. for a time from about 1 second to about 3 minutes to remove the copper oxide layer 404 from the copper pad 402. For example, the structure is heated to a temperature of about 410° C. for 12 seconds to remove the copper oxide layer 404 from the copper pad 402.

After the copper oxide layer 404 is removed, a sulfide compound mixture containing at least one sulfide compound and at least one inert gas is contacted with the copper pad 402 for a time from about 1 second to about 60 minutes at a temperature from about 15° C. to about 500° C. to form copper-sulfur bonds within the copper pad 402. For example, a mixture containing about 2% by weight of hydrogen sulfide and about 98% by weight of nitrogen is contacted with the copper pad 402 for about 25 minutes at a temperature of about 75° C. to form copper-sulfur bonds.

After contacting the sulfide compound mixture with the copper pad 402 and forming copper-sulfur bonds within the copper pad 402, within the same chamber a copper vapor precursor mixture is contacted with the copper pad 402 to form the copper sulfide layer 408. The copper vapor precursor mixture containing at least one copper vapor precursor and at least one inert gas is contacted with the copper pad 402 for a time from about 1 second to about 60 minutes at a temperature from about 15° C. to about 500° C. to form copper sulfide layer 408. For example, a mixture containing essentially about 3% by weight of copper TMHD and about 97% by weight of nitrogen is contacted with the copper pad 402 for about 15 minutes at a temperature of about 70° C. to form a copper sulfide layer 408.

The process cycle including contacting the sulfide compound mixture with the copper pad 402 and contacting the copper vapor precursor mixture with the copper pad 402 may be repeated for a given number of cycles necessary for forming the copper sulfide layer 408 on the copper pad 402. For example, the copper sulfide layer formation process cycle is performed about 50 times. In this example, the copper sulfide layer has a thickness of about 350 Å.

The copper oxide reduction/removal is optional in the sense that the copper sulfide region may be formed in the copper pad 402 before copper oxide forms on the copper pad surface.

Figure 10:
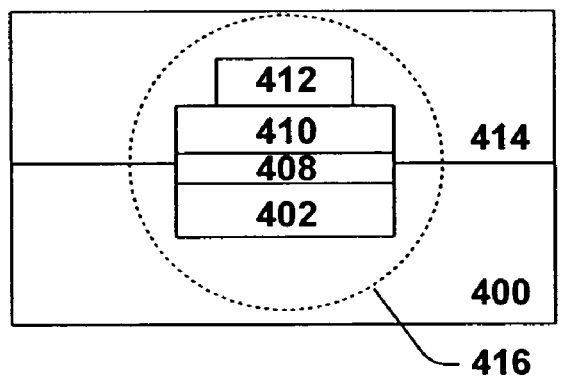
FIG. 10 shows a cross sectional view of forming a memory cell in accordance with one aspect of the invention.

Referring to FIG. 10, an active layer 410 containing an organic semiconductor such as polyacetylene is formed over the copper sulfide region 408 using CVD techniques. Another electrode 412 is formed over the active layer 410. In this example, the electrode 412 contains aluminum. A dielectric encasement layer 414 is formed thereover. Consequently, a memory cell 416 is provided.

The memory cells/devices are useful in any device requiring memory. For example, the memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a copper sulfide layer on a substrate comprising at least copper, comprising:
   contacting a sulfide compound with the substrate; and thereafter
   contacting a copper vapor precursor with the substrate to form the copper sulfide layer.

2. The method of claim 1, wherein the sulfide compound has a general formula of $R_2S$, wherein each R is independently a Group IA element or an organic group.

3. The method of claim 1, wherein the sulfide compound comprises from about 0.1% to about 100% by weight of the sulfide compound and from about 0% to about 99.9% by weight of at least one inert gas.

4. The method of claim 1, wherein the copper vapor precursor comprises from about 0.1% to about 100% by weight of the copper vapor precursor and from about 0% to about 99.9% by weight of at least one inert gas.

5. The method of claim 1, wherein the sulfide compound is contacted with the substrate for a time from about 1 second to about 60 minutes at a temperature from about 15° C. to about 500° C.

6. The method of claim 1, wherein the copper vapor precursor is contacted with the substrate for a time from about 1 second to about 60 minutes at a temperature from about 15° C. to about 500° C.

7. The method of claim 1, wherein the copper vapor precursor comprises at least one selected from the group consisting of a copper halide, copper acetyl acetonate, copper tetramethyl heptanedionate, cyclopentadienyl-copper-trialkylphosphine, t-butoxy-copper-t-butyldifluorophosphane, t-butoxy-copper-phenyldifluorophosphane, t-butoxy-copper-diethylaminodifluorophosphane, 2-trifluoromethylpropane-2-oxy-copper-t-butylisonitrile, 2-trifluoromethylpropane-2-oxy-copper-trimethylphosphane, perfluoro-t-butoxy-copper-t-butylisonitrile, perfluoro-t-butoxy-copper-trimethylphosphane, $C_5H_5$—Cu-t-BuNC and Cu(hfac)R, where R is at least one of 1,5-cyclooctadiene, hexyne, butyne, trimethylvinylsilyl, bis(trimethylsilyl)acetylene, triethoxyvinylsilane and trimethylallylsilane.

8. The method of claim 1, wherein the method comprises contacting the sulfide compound with the substrate and forming a copper-sulfur bond on a surface of the substrate; and thereafter contacting the copper vapor precursor with the substrate and forming an additional copper-sulfur bond between a copper element of the copper vapor precursor and a sulfur element that is previously attached to the substrate, and the copper sulfide layer has a thickness of about 2 Å or more and about 0.1 μm or less.

9. The method of claim 2, wherein the organic group comprises at least one aliphatic or aromatic organic moiety having from about 1 to about 100 carbon atoms which may include one or more oxygen, sulfur, or nitrogen, or fluorine atoms, wherein the aliphatic chain may be linear, branched, saturated or unsaturated, and wherein either the aliphatic chain or the aromatic ring may have substituted groups thereon.

10. A method of making a memory cell comprising:
   providing a first electrode comprising at least copper;
   contacting a sulfide compound with the first electrode and thereafter contacting a copper vapor precursor with the first electrode to form a copper sulfide layer on the first electrode;
   forming an active layer over the copper sulfide layer; and
   forming a second electrode over the active layer.

11. The method of claim 10, wherein the sulfide compound has a general formula of $R_2S$, wherein each R is independently a Group IA element or an organic group.

12. The method of claim 10, wherein the sulfide compound comprises from about 0.1% to about 100% by weight of the sulfide compound and from about 0% to about 99.9% by weight of at least one inert gas.

13. The method of claim 10, wherein the copper vapor precursor comprises from about 0.1% to about 100% by weight of the copper vapor precursor and from about 0% to about 99.9% by weight of at least one inert gas.

14. The method of claim 10, wherein the sulfide compound is contacted with the first electrode for a time from about 1 second to about 60 minutes at a temperature from about 15° C. to about 500° C.

15. The method of claim 10, wherein the copper vapor precursor is contacted with the first electrode for a time from about 1 second to about 60 minutes at a temperature from about 15° C. to about 500° C.

16. The method of claim 10, wherein the copper vapor precursor comprises at least one selected from the group consisting of a copper halide, copper acetyl acetonate, copper tetramethyl heptanedionate, cyclopentadienyl-copper-trialkylphosphine, t-butoxy-copper-t-butyldifluorophosphane, t-butoxy-copper-phenyldifluorophosphane, t-butoxy-copper-diethylaminodifluorophosphane, 2-trifluoromethylpropane-2-oxy-copper-t-butylisonitrile, 2-trifluoromethylpropane-2-oxy-copper-trimethylphosphane, perfluoro-t-butoxy-copper-t-butylisonitrile, perfluoro-t-butoxy-copper-trimethylphosphane, $C_5H_5$—Cu-t-BuNC and Cu(hfac)R, where R is at least one of 1,5-cyclooctadiene, hexyne, butyne, trimethylvinylsilyl, bis(trimethylsilyl)acetylene, triethoxyvinylsilane and trimethylallylsilane.

17. The method of claim 10, wherein the active layer comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenlacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

18. The method of claim 10, wherein the method comprises contacting the sulfide compound with the first electrode and forming a copper-sulfur bond on a surface of the first electrode; and thereafter contacting the copper vapor precursor with the first electrode and forming an additional copper-sulfur bond between a copper element of the copper vapor precursor and a sulfur element that is previously attached to the first electrode, and the copper sulfide layer has a thickness of about 2 Å or more and about 0.1 µm or less.

19. The method of claim 11, wherein the organic group comprises at least one aliphatic or aromatic organic moiety having from about 1 to about 100 carbon atoms which may include one or more oxygen, sulfur, or nitrogen, or fluorine atoms, wherein the aliphatic chain may be linear, branched, saturated or unsaturated, and wherein either the aliphatic chain or the aromatic ring may have substituted groups thereon.

20. A copper sulfide layer on a substrate comprising at least copper, the copper sulfide layer made by contacting a sulfide compound with the substrate and thereafter contacting a copper vapor precursor with the substrate.

21. The method of claim 20, wherein the sulfide compound has a general formula of $R_2S$, wherein each R is independently a Group IA element or an organic group.

22. The method of claim 20, wherein the sulfide compound comprises from about 0.1% to about 100% by weight of the sulfide compound and from about 0% to about 99.9% by weight of at least one inert gas.

23. The method of claim 20, wherein the copper vapor precursor comprises from about 0.1% to about 100% by weight of the copper vapor precursor and from about 0% to about 99.9% by weight of at least one inert gas.

24. The method of claim 20, wherein the sulfide compound is contacted with the first electrode for a time from about 1 second to about 60 minutes at a temperature from about 15° C. to about 500° C.

25. The method of claim 20, wherein the copper vapor precursor is contacted with the first electrode for a time from about 1 second to about 60 minutes at a temperature from about 150° C. to about 500° C.

26. The method of claim 20, wherein the copper vapor precursor comprises at least one selected from the group consisting of a copper halide, copper acetyl acetonate, copper tetramethyl heptanedionate, cyclopentadienyl-copper-trialkylphosphine, t-butoxy-copper-t-butyldifluorophosphane, t-butoxy-copper-phenyldifluorophosphane, t-butoxy-copper-diethylaminodifluorophosphane, 2-trifluoromethylpropane-2-oxy-copper-t-butylisonitrile, 2-trifluoromethylpropane-2-oxy-copper-trimethylphosphane, perfluoro-t-butoxy-copper-t-butylisonitrile, perfluoro-t-butoxy-copper-trimethylphosphane, $C_5H_5$—Cu-t-BuNC and Cu(hfac)R, where R is at least one of 1,5-cyclooctadiene, hexyne, butyne, trimethylvinylsilyl, bis(trimethylsilyl)acetylene, triethoxyvinylsilane and trimethylallylsilane.

27. The method of claim 20, wherein the copper sulfide layer is made by contacting the sulfide compound with the substrate and forming a copper-sulfur bond on a surface of the substrate, and thereafter contacting the copper vapor precursor with the substrate and forming an additional copper-sulfur bond between a copper element of the copper vapor precursor and a sulfur element that is previously attached to the substrate, and the copper sulfide layer has a thickness of about 2 Å or more and about 0.1 µm or less.

28. The method of claim 21, wherein the organic group comprises at least one aliphatic or aromatic organic moiety having from about 1 to about 100 carbon atoms which may include one or more oxygen, sulfur, or nitrogen, or fluorine atoms, wherein the aliphatic chain may be linear, branched, saturated or unsaturated, and wherein either the aliphatic chain or the aromatic ring may have substituted groups thereon.

* * * * *